US007175712B2

(12) United States Patent
Siegel

(10) Patent No.: US 7,175,712 B2
(45) Date of Patent: *Feb. 13, 2007

(54) LIGHT EMITTING APPARATUS AND METHOD FOR CURING INKS, COATINGS AND ADHESIVES

(75) Inventor: Stephen B. Siegel, Chicago, IL (US)

(73) Assignee: Con-Trol-Cure, Inc., Chicago, IL (US)

(*) Notice: Subject to any disclaimer, the term of this patent is extended or adjusted under 35 U.S.C. 154(b) by 128 days.

This patent is subject to a terminal disclaimer.

(21) Appl. No.: 10/339,264

(22) Filed: Jan. 9, 2003

(65) Prior Publication Data

US 2004/0135159 A1 Jul. 15, 2004

(51) Int. Cl.

*H01L 31/14* (2006.01)
*H05B 33/02* (2006.01)
*C08J 7/18* (2006.01)
*C08F 2/48* (2006.01)
*B05D 3/06* (2006.01)

(52) U.S. Cl. ....................... 118/620; 118/642; 427/492; 427/493; 427/511; 427/510; 250/553; 250/494.1; 250/504 R; 257/88

(58) Field of Classification Search ................ 427/492, 427/493, 508, 511, 516; 118/620, 641, 642, 118/643; 250/553, 494.1, 504 R, 504 H; 257/88

See application file for complete search history.

(56) References Cited

U.S. PATENT DOCUMENTS 3,737,051 A * 6/1973 Horino ....................... 414/788

(Continued)

FOREIGN PATENT DOCUMENTS

GB 9912437.2 5/1999

(Continued)

OTHER PUBLICATIONS

"Photoinitiators for UV Curing", by Ciba Specialty Chemicals, Edition 2001, Switzerland, Dec. 1, 2001.

(Continued)

*Primary Examiner*—Marianne Padgett
(74) *Attorney, Agent, or Firm*—Welsh & Katz, Ltd.; Thomas W. Tolpin

(57) ABSTRACT

A UV curing apparatus and method is provided for enhancing the distribution and application of UV light to UV photo initiators in a UV curable ink, coating or adhesive. The UV curing apparatus and method comprises UV LED assemblies in a first row with the UV LED assemblies spaced from adjacent UV LED assemblies. At least one second row of a plurality of UV LED assemblies are provided next to the first row but with the UV LED assemblies of the second row positioned adjacent the spaces between adjacent UV LED assemblies in the first row thereby to stagger the second row of UV LED assemblies from the UV LED assemblies in the first row. Desirably, the rows of staggered UV LED assemblies are mounted on a panel. UV curable products, articles or other objects containing UV photo initiators that are in or on a web can be conveyed or otherwise moved past the rows of UV LED assemblies for effective UV curing. This arrangement facilitates more uniformly application of UV light on the UV curable ink, coating and/or adhesives in the UV curable products, articles or other objects. The apparatus can include one or more of the following: rollers for moving the web, mechanisms for causing the panel to move in an orbital or reciprocal path, and an injection tube for injecting a non-oxygen gas in the area of UV light curing.

5 Claims, 5 Drawing Sheets

U.S. PATENT DOCUMENTS

| | | | | |
|---|---|---|---|---|
| 3,800,160 | A * | 3/1974 | Ishizawa et al. | 377/6 |
| 4,010,374 | A | 3/1977 | Ramler | |
| 4,145,136 | A * | 3/1979 | Takahashi | 399/153 |
| 4,309,452 | A | 1/1982 | Sachs | 427/44 |
| 4,980,701 | A * | 12/1990 | Contois et al. | 347/242 |
| 4,990,971 | A | 2/1991 | Le Creff | 357/17 |
| 5,062,723 | A * | 11/1991 | Takeda et al. | 101/407.1 |
| 5,278,432 | A | 1/1994 | Ignatius et al. | 257/88 |
| 5,420,768 | A * | 5/1995 | Kennedy | 362/119 |
| 5,535,673 | A | 7/1996 | Bocko et al. | 101/211 |
| 5,634,711 | A * | 6/1997 | Kennedy et al. | 362/119 |
| 5,660,461 | A | 8/1997 | Ignatius et al. | 362/241 |
| 5,762,867 | A | 6/1998 | D'Silva | 422/44 |
| 5,764,263 | A | 6/1998 | Lin | |
| 5,857,767 | A | 1/1999 | Hochstein | 362/294 |
| 5,963,240 | A * | 10/1999 | Shinohara et al. | 347/116 |
| 5,986,682 | A * | 11/1999 | Itou | 347/171 |
| 6,075,595 | A * | 6/2000 | Malinen | 356/328 |
| 6,092,890 | A | 7/2000 | Wen et al. | 347/101 |
| 6,112,037 | A * | 8/2000 | Nagata et al. | 399/45 |
| 6,145,979 | A | 11/2000 | Caiger et al. | |
| 6,163,036 | A | 12/2000 | Taninaka et al. | 257/88 |
| 6,185,394 | B1 * | 2/2001 | Lee | 399/116 |
| 6,188,086 | B1 | 2/2001 | Masuda et al. | 257/98 |
| 6,200,134 | B1 * | 3/2001 | Kovac et al. | 433/29 |
| 6,354,700 | B1 | 3/2002 | Roth | |
| 6,425,663 | B1 | 7/2002 | Eastlund et al. | |
| 6,447,112 | B1 | 9/2002 | Hu et al. | |
| 6,457,823 | B1 | 10/2002 | Cleary et al. | 347/102 |
| 6,498,355 | B1 | 12/2002 | Harrah et al. | 257/99 |
| 6,525,752 | B2 | 2/2003 | Vackier et al. | |
| 6,536,889 | B1 * | 3/2003 | Biegelsen et al. | 347/95 |
| 6,561,640 | B1 * | 5/2003 | Young | 347/102 |
| 6,630,286 | B2 | 10/2003 | Kramer | |
| 6,671,421 | B1 * | 12/2003 | Ogata et al. | 382/284 |
| 6,683,421 | B1 | 1/2004 | Kennedy et al. | 315/291 |
| 6,783,810 | B2 | 8/2004 | Jin et al. | |
| 7,137,696 | B2 * | 11/2006 | Siegel | 347/102 |
| 2001/0030866 | A1 | 10/2001 | Hochstein | 362/294 |
| 2001/0032985 | A1 * | 10/2001 | Bhat et al. | 257/88 |
| 2001/0046652 | A1 | 11/2001 | Ostler et al. | 433/29 |
| 2001/0048814 | A1 | 12/2001 | Lenmann et al. | 396/154 |
| 2001/0052920 | A1 | 12/2001 | Matsumoto et al. | |
| 2002/0015234 | A1 * | 2/2002 | Suzuki et al. | 359/683 |
| 2002/0016378 | A1 * | 2/2002 | Jin et al. | 522/1 |
| 2002/0044188 | A1 | 4/2002 | Codos | 347/106 |
| 2002/0074559 | A1 | 6/2002 | Dowling et al. | 257/99 |
| 2002/0149660 | A1 | 10/2002 | Cleary et al. | 347/102 |
| 2002/0175299 | A1 | 11/2002 | Kanie et al. | 250/504 |
| 2003/0218880 | A1 * | 11/2003 | Brukilacchio | 362/293 |
| 2004/0011457 | A1 * | 1/2004 | Kobayashi et al. | 156/272.2 |
| 2004/0090794 | A1 * | 5/2004 | Ollett et al. | 362/555 |
| 2004/0134603 | A1 | 7/2004 | Kobayashi et al. | 156/272.8 |
| 2004/0156130 | A1 * | 8/2004 | Powell et al. | 359/845 |
| 2005/0104946 | A1 * | 5/2005 | Siegel | 347/102 |
| 2005/0152146 | A1 * | 7/2005 | Owen et al. | 362/294 |
| 2005/0222295 | A1 * | 10/2005 | Siegel | 522/8 |

FOREIGN PATENT DOCUMENTS

| | | | | | |
|---|---|---|---|---|---|
| GB | 2350321 | A | | 11/2000 | |
| GB | 0215168.6 | | | 7/2002 | |
| GB | 0229825.5 | | | 12/2002 | |
| GB | 2390332 | A | | 1/2004 | |
| GB | 2396331 | A | | 6/2004 | |
| JP | 60-126830 | A | * | 7/1985 | 257/E21.211 |
| JP | 1-124324 | | * | 5/1989 | |
| JP | 5-323462 | | * | 12/1993 | 355/50 |
| JP | 2000-268416 | B | | 9/2000 | |
| JP | 2001-209980 | B | | 8/2001 | |
| JP | 2005-129662 | B | | 5/2005 | |
| WO | PCT/GB2003/002834 | | | 7/2003 | |
| WO | PCT/US2003/023504 | | | 7/2003 | |
| WO | WO 2004/002746 | A1 | | 1/2004 | |
| WO | WO 2004/011848 | A2 | | 2/2004 | |

OTHER PUBLICATIONS

"Optical Properties of Si-Doped AlxGa1-xN/AlyGa1-yN (x=0.24-0.53, y=0.11) Multi-Quantum-Well Structures" by H. Hirayama and Y. Aoyagi, The Institute of Physical and Chemical Research, Saitama, Japan, MRS Internet J. Nitride Semicond. Res. 4S1, G3.74(1999), no month.

Publication: "*Photoinitiators for UV Curing Formulators' Guide for Coatings, Additives*", by Ciba Specialty Chemicals, Edition 2001, Switzerland. no month.

* cited by examiner

LIGHT EMITTING APPARATUS AND METHOD FOR CURING INKS, COATINGS AND ADHESIVES

BACKGROUND OF THE INVENTION

1. Field of the Invention

The present invention relates to a method and apparatus for utilizing ultraviolet (UV) light emitting diodes in staggered arrays and mechanisms for moving the arrays to avoid "hot spots" and provide a uniform application of ultraviolet light to a moving object including inks, coatings or adhesives having UV photo initiators for converting, when exposed to UV light, monomers in the inks, coatings or adhesives to linking polymers to solidify the monomer material. Also, an inert, non-oxygen, gas is injected into the area where the staggered arrays of ultraviolet light emitting diodes, UV-LED's are positioned to apply UV light to the moving objects to enhance the curing of the ultraviolet activated UV photo initiators.

2. Description of the Prior Art

Heretofore, ultraviolet lamps have been used for the curing of ultraviolet inks, coatings and adhesives.

More recently, EXFO and EFOS of Mississauga, Ontario, Canada have developed UV light emitting diodes (LED's) and gathered them in large numbers for use in curing ultraviolet light sensitive monomers to polymerize the monomers and solidify the ink, coating or adhesive.

While the use of a large number of UV-LED's provide many efficiencies, namely in cost and energy consumption, there is still the problem of effective curing with low intensity UV-LED's and with respect to "hot spots" which provide more curing at "hot spots" then at other locations in the ink, coating or adhesive being cured.

Also, in the UV-LED prior art, the LED is positioned to achieve uniformity for back light displays and other lighting applications. The criteria for such uniformity are primarily designed to create an appearance that the backlight is uniform for a visual appearance.

It is, therefore, desirable to provide an improved UV method and apparatus for applying UV light emitted from UV LED's more uniformly and avoid hot spots to more effectively cure UV inks, coatings and adhesives.

BRIEF SUMMARY OF THE INVENTION

As will be described in greater detail hereinafter, the method and device of the present invention provide techniques and structures for applying UV light emitted from UV-LED's more uniformly so that such light is more effective in curing inks, coatings and adhesives and, by applying the UV light more evenly, reducing, if not all together eliminating, "hot spots".

According to the present invention there is provided staggered arrays of UV LED assemblies on a panel with the UV LED assemblies being arranged in rows with each row being staggered from adjacent rows.

In addition to the staggering of the UV LED assemblies in adjacent rows, a UV curable product, article or other object having a UV ink, coating or adhesive to be cured, is moved on or in a web past, and closely adjacent, the arrays.

Further, the panel is moved or translated in an X direction and in a Y direction, much like an orbital sander, thereby to cause a slight sweeping of the light from each UV LED assembly over an orbital area, e.g., in a circular or elliptical pattern, thereby minimizing the creation of "hot spots" and to uniformly apply UV light to the product, article or other object having the UV ink, coating or adhesive.

In one preferred embodiment, the web containing the UV curable product, article or other object to be cured is arranged to move vertically. A gas having a molecular weight heavier than air can be injected at the upper end of the path of movement of the UV curable product, article or other object having a UV ink, coating, or adhesive thereon as it moves past a panel of arrays of UV LED assemblies. Furthermore, a gas having a molecular weight lighter than air can be injected at the lower end of the path of movement of the UV curable product, article or other object having a UV ink, coating or adhesive thereon as it moves past the panel of arrays of UV LED assemblies.

The method and apparatus of the present invention provide uniformity of light application from a flat panel having an array of UV-LED's. This result is obtained when the product and/or the light fixture is moved relative to and across the UV light beams from the UV-LED assemblies. This movement in of itself has the ability to offer one element of uniformity. That is, the movement of the product or the movement of the light array addresses the problem of providing uniformity in the direction of the product flow or of the lamp movement.

The "X Axis" uniformity is addressed by the movement of the product or of the LED array.

The "Y Axis" uniformity is addressed by how the LED chips are arranged. To achieve the cure rates that are associated with typical UV curing applications, a very large number of UV-LED chips are arranged to deliver, the amount of UV energy necessary to cure the polymers.

The first step in building these arrays is to create either a series or parallel electrical circuit either in series or in which the LED chips are placed in a linear fashion of equal distance from each other. (Lets say a distance of X). The second row would start its row at a distance ½ X and each LED chip would then be spaced from adjacent LED chips in the row by the distance X.

The third row would start at a distance ½ X in from the start of the second row. This offset would continue for each row of LED chips in the array. Two things happen when this is done. First the light uniformity is increased because of the alternating position of the UV-LED chips. This creates an overlap of light emissions. Then, having each row begin half the distance of the row it precedes will create a stair case effect. This will allow uniformity in the Y Axis as the array grows in size.

There is another way to position the LED chips, and achieve the same uniformity. This would be to use 3 rows to achieve the uniformity. That is, to have the LED chips arranged at a distance of X, and to have the next row (row 2) start at a distance ⅓ in from the start of the first row and the next row (row 3) start at a distance ⅔ in from the start of the first row or at a distance ⅓ in from the start of the second row.

Still another way is to provide 4 rows to create the uniformity, with the LED chips in the first row being spaced at a distance of X from each other. The second row starts its first LED chip at a distance ¼ X in from the first LED chip in the first row. The third row starts its row at a distance ½ X in from the first LED chip in the first row or at a distance ¼ X in from the start of the previous row.

The method and apparatus of the present invention also address a very large number of LEDs that are mounted in long multiple rows, and still have a uniform distribution of light.

Additionally, in situations where UV curable ink or adhesive may splatter onto the array of LED's, a thin transparent plastic sheet or layer is positioned over the array to protect the array, and the sheet or layer is periodically cleaned or replaced.

A more detailed explanation of the invention is provided in the following detailed description and claims taken in conjunction with the accompanying drawings.

DETAILED DESCRIPTION OF THE INVENTION

A detailed description of the preferred embodiments and best modes for practicing the invention are described herein.

Figure 1:
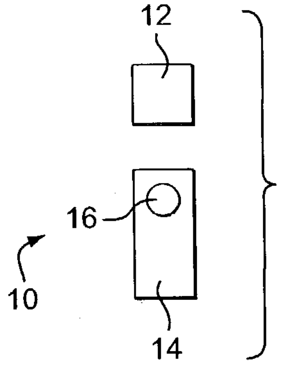
FIG. 1 PRIOR ART
FIG. 1 is a top plan elevational view of an UV LED assembly including a pad for a cathode and an anode mounting an UV LED chip in accordance with the teachings of the present invention.

Referring now to the drawings in greater detail, there is illustrated in FIG. 1 a prior art ultraviolet light-emitting diode (UV LED) assembly 10 including a cathode pad 12 and an anode 14 mounting a chip 16, which comprises a UV LED chip 16.

Each cathode pad 12 (FIG. 1) is connected to a wire conductor as is each anode 14.

Figure 2:
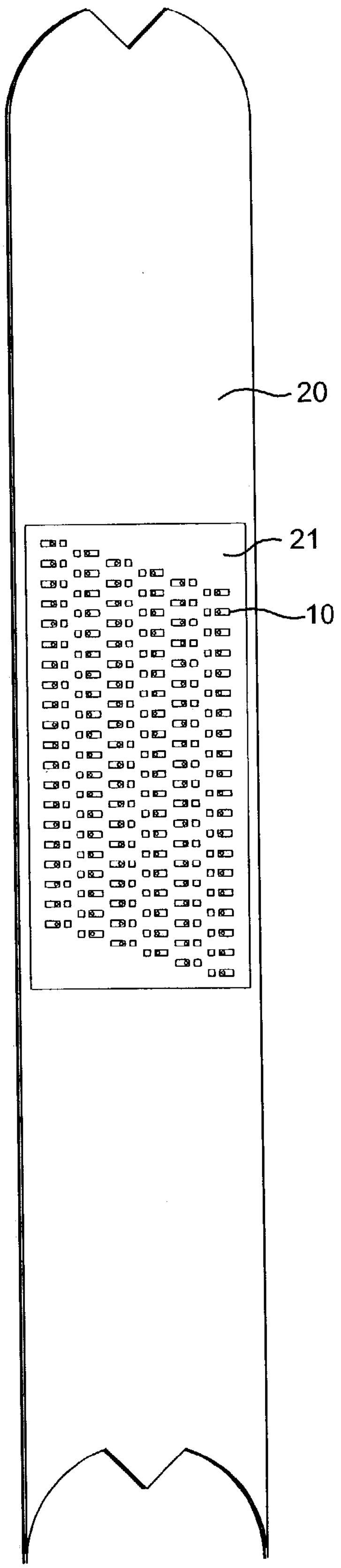
FIG. 2 is a top plan elevational view of a design of mating building blocks or substrates which can be blank or have an anode and cathode mounted thereon in accordance with the teachings of the present invention.
Figure 3:
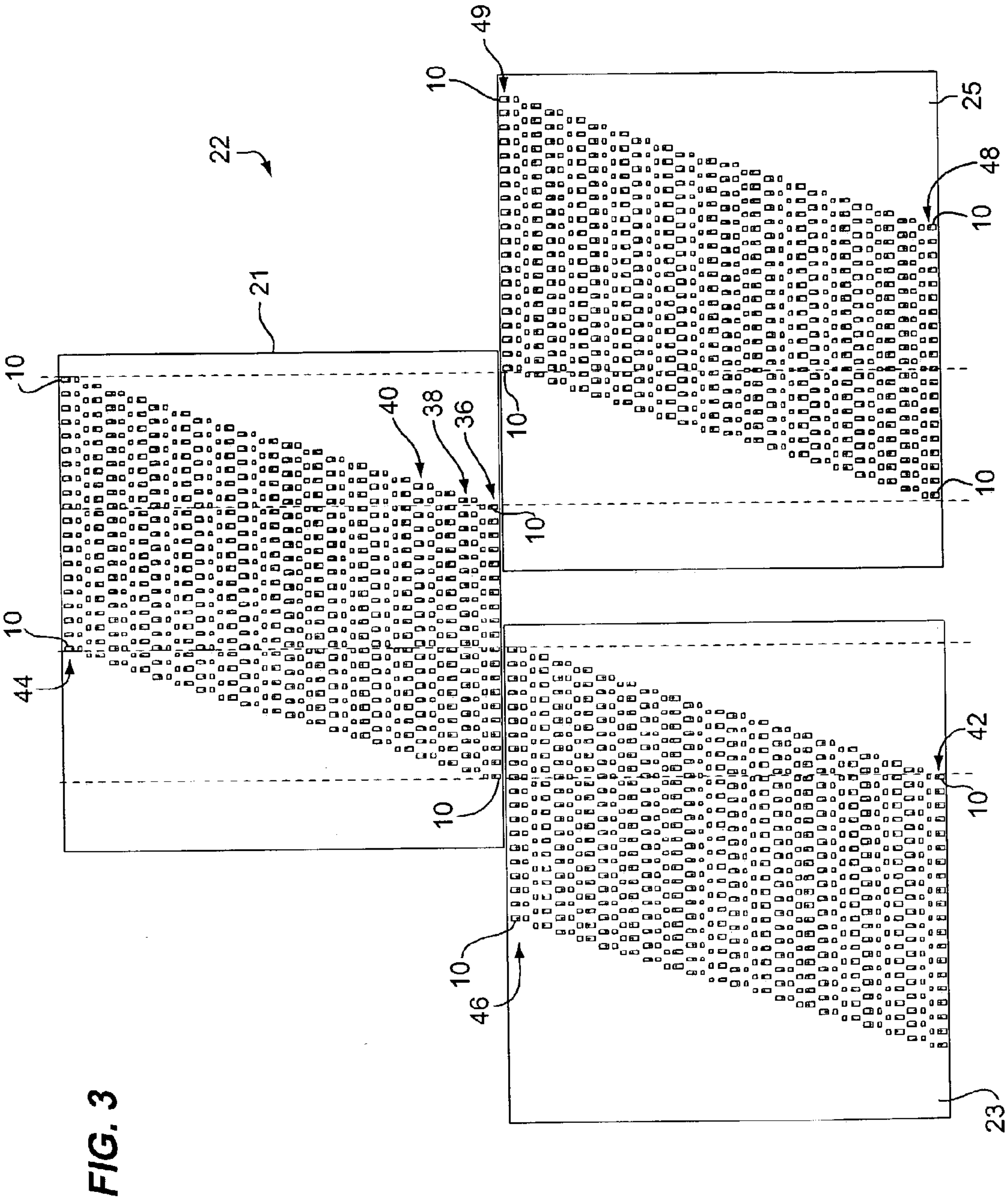
FIG. 3 is a front elevational view of one array of UV LED assemblies wherein rows of UV LED assemblies are arranged in the array with alternate rows of UV LED assemblies in one row being staggered from the UV LED assemblies in the adjacent rows in accordance with the teachings of the present invention.
Figure 4:
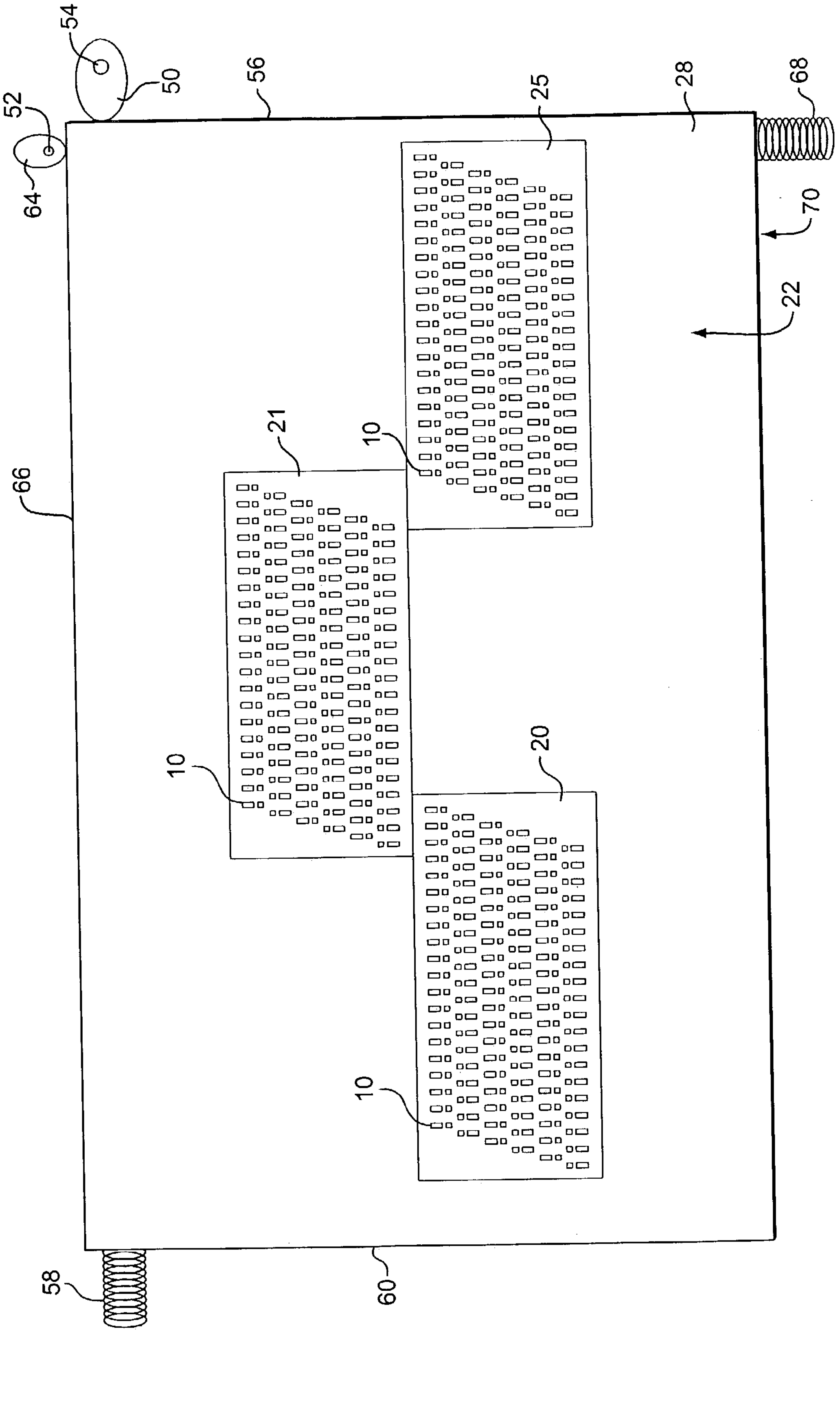
FIG. 4 is front elevational view of a panel of six arrays of UV LED assemblies shown in FIG. 3 in accordance with the teachings of the present invention and shows schematically a first eccentric cam which moves against one side edge of the panel against a spring at the opposite side edge of the panel so as to move, reciprocate or translate the panel in an X direction and a second eccentric cam which acts against an upper edge of the panel and against a spring bearing against a lower edge of the panel to cause movement of the panel in the Y direction and thereby cause all the arrays to move in a orbital, circular, or elliptical path when the first and second cams are rotated about their axes.

Referring now to FIG. 2, there is illustrated therein a building block 20 having a first array 21 of the UV LED assemblies 10 thereon, namely, pads 12 and anodes 14, which provide a plurality of UV LED chips 16. The building block 20 is designed to mate with similar building blocks to form a group 22 of arrays 21, 23 and 25 as shown in FIGS. 3 and 4. In this way, several of the blocks 20 can matingly engage each other and be arranged in a pattern (e.g. like tiles on a floor) on a panel 28 (FIG. 4).

As shown in FIG. 3, the UV LED assemblies 10 in each array 21, 23 and 25 are spaced apart in a first lower row 36 of UV LED assemblies 10. Then, in a second adjacent row 38, the UV LED assemblies 10 are arranged in a staggered manner so that they are located above the spaces between the UV LED assemblies 10 in the first row. In the same manner, the next upper row 40 of UV LED assemblies 10 is staggered and a total of twenty (20) staggered rows are provided in the UV LED array 21 shown in FIG. 3.

Also, as shown in FIG. 3 the beginning of the first UV LED assembly 10 in the lowest row 36 in the first array 21 is aligned with the end of the last UV LED assembly 10 at the end of the lowest row 42 in the second, lower left, array 23.

Then, the beginning of the first UV LED assembly 10 in the uppermost row 44 in the first array 21 is aligned with the end of the last UV LED assembly 10 in the uppermost row 46 in the second, lower left array 23. Next, the end of the last UV LED assembly 10 in the lowest row 36 in the first array 21 is aligned with the beginning of the first UV LED assembly 10 in the lowest row 48 in the third, lower right array 25. Finally, the end of the last UV LED assembly 10 in the uppermost row 44 in the first array 21 is aligned with the beginning of the first UV LED assembly 10 in the uppermost row 49 in the third, lower right array 25, as shown in FIG. 3.

As shown best in FIG. 4, the three arrays 21, 23 and 25 can be arranged on the panel 28 in a staggered manner so that the UV light from each UV LED assembly 10 is not only spaced and staggered relative to adjacent rows in the array but also spaced and staggered relative to the rows in the other arrays. Also more than three arrays 21, 23 and 25 can be provided, such as six arrays, not shown.

Also shown in FIG. 4, are mechanisms, preferably cams 50 and 64, that can be provided for moving, translating or reciprocating the panel 28 back and forth in the X direction and up and down in the Y direction, much like in an orbital sander. The first, x axis, cam 50 is eccentrically mounted for rotation about a shaft 54 to act against one side edge 56 of the panel 28 with a spring 58, such as a helical tension spring, positioned to act against the other side edge 60 of the panel 28. The center of cam 50 is spaced apart and offset from the center of shaft 54 so that the cam 50 is not aligned nor coaxial with shaft 54.

Then the second, y axis, cam 64 (FIG. 4) is eccentrically mounted for rotation on a shaft 52 to act against an upper edge 66 of the panel 28 against the action of a spring 68, such as a helical tension spring, positioned to act against a lower edge 70 of the panel 28. The center of cam 64 is spaced apart and offset from the center of shaft 52 so that the cam 64 is not aligned nor coaxial with shaft 52.

Rotation of the shafts 52 and 54 (FIG. 4) each by a prime mover such as a variable speed motor (not shown) can cause the panel 28 to move in a generally orbital, annular, circular, or elliptical path of movement. This will result in orbital movement of each UV LED assembly 10 in each of the rows in each of the arrays 21, 23 and 25 mounted on the panel 28 so as to spread out the emitted UV light and uniformly apply the UV light to the products, articles or other objects to be UV cured. This spreading of the UV light also minimizes, if not altogether eliminates the creation of, so called "hot spots" of UV light.

Figure 5:
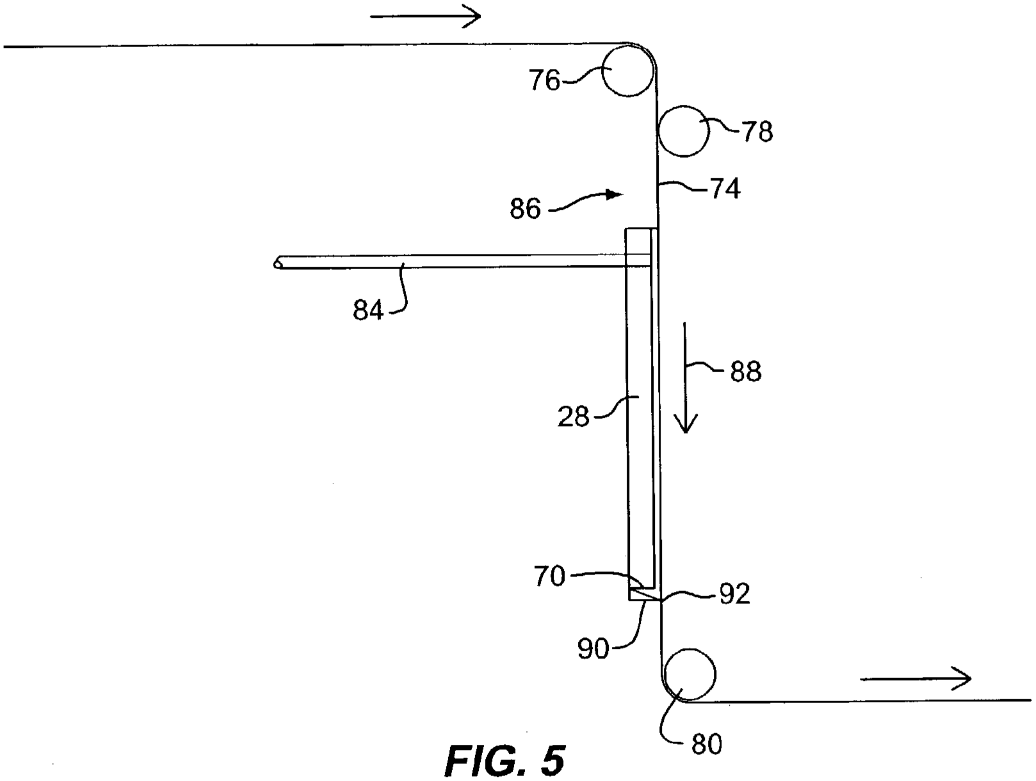
FIG. 5 is a block schematic diagram of a web made of, or carrying products, articles or other objects to be UV cured trained over rollers to move in a generally vertical path past the panel of arrays of UV LED assemblies shown in FIG. 4 such that the products, articles or other objects with UV photo initiators therein can be cured as each product, article or other object moves past the arrays of UV LED assemblies while a non-oxygen, heavier than air gas is injected from a gas tube located near the top of the path of movement of the web.

As shown in FIG. 5, where a schematic block diagram of one UV curing apparatus, assembly, mechanism or device constructed according to the teachings of the present invention is shown, the panel 28 of UV LED arrays 21, 23 and 25 is positioned generally vertically and closely adjacent the path of movement of a conveyor belt comprising web 74 which is trained over rollers 76, 78 and 80 to move generally upright and vertically past and closely adjacent and in proximity to the panel of UV LED arrays 21, 23 and 25. For this purpose, at least one of the rollers 76, 78 and/or 80 of a conveyor can be a drive roller.

UV curable products, articles or other objects, such as labels, positioned in or on the web 74 (FIG. 5), can have one or more UV curable inks, coatings and/or adhesives between a plastic cover layer and the label. The UV curable ink, coating, and/or adhesive can have UV photo initiators therein which will polymerize the monomers in the UV curable ink, coating, or adhesive when subjected to UV light within a predetermined UV wavelength range.

The UV curable ink, coating and/or adhesive is preferably located on the side of the web 74 (FIG. 5) that is closest to and faces the panel 28. Preferably, the spacing between the UV LED assemblies and the ink, coating or adhesive is between 0.001 inch and 0.3 inch to enhance the effectiveness of the UV emitted light which dissipates exponentially as the distance to the product, article or other UV curable object to be treated increases.

Preferably, the shafts 52 and 64 (FIG. 4) are rotated to cause orbital movement of the panel 28 and UV LED assemblies as the web 74 containing the product, article or other UV curable object moves past the panel 28. Such movement also minimizes "hot spots" and provide uniform sweeping, distribution, and application of the UV light from the UV LED assemblies 10.

The block schematic diagram of the assembly or device, shown in FIG. 5 is provided to minimize exposure of the products, articles or other objects during curing to oxygen, which inhibits UV curing. A gas tube 84 providing an upper gas injector is provided on the assembly and device for injecting heavier-than-air, gas, e.g., carbon dioxide, near an upper end 86 of a path of downward movement, indicated by the arrow 88, of the web 74, so that the gas can flow downwardly in the space between the panel 28 and the web 74 to provide an anaerobic area between the UV LED assemblies 10 on the panel 28 and the web 74 having UV curable products, articles or other objects to be cured.

A wiper blade 90 (FIG. 5) providing a lower inhibitor can be positioned adjacent the lower edge 70 of the panel 28 for holding, compressing, collecting and/or blanketing the gas in the area between the orbiting UV LED arrays 21, 23 and 25 (FIG. 4) and the moving web 74 (FIG. 5). Preferably the wiper blade 90 is fixed to the lower edge 70 of the panel 28 and has an outer edge 92 that is positioned to wipe against the moving web 74. In this way, the injected gas can be inhibited from escaping the curing area.

Figure 6:
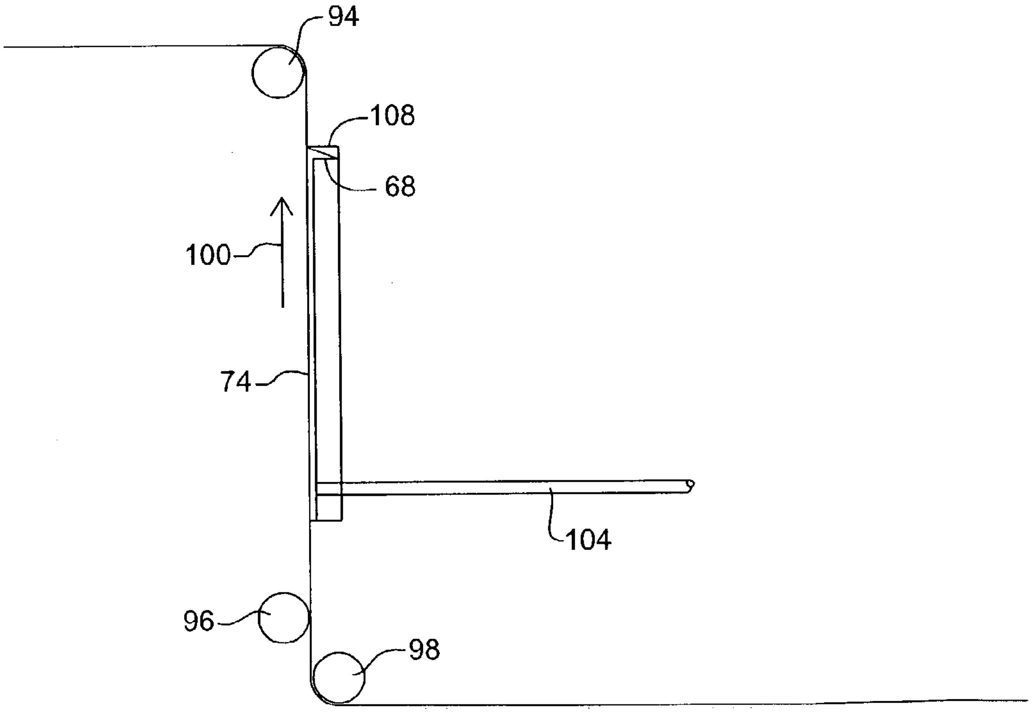
FIG. 6 is a block schematic view of a web made of, or carrying, products, articles or other objects to be UV cured trained over rollers to move in a generally vertical path past the panel of arrays of UV LED assemblies shown in FIG. 4 such that each product, article or other object with UV photo initiators therein can be cured as each product, article or other object moves past the arrays of UV LED assemblies while a non-oxygen gas is injected from a gas tube located near the bottom of the path of movement of the web.

FIG. 6 is a block schematic diagram of a UV curing apparatus, assembly, mechanism or device constructed according to the teachings of the present invention where the moving web 74 is trained about rollers 94, 96 and 98, at least one of which can be a drive roller, to cause the web 74 with the UV curable products, articles or other objects thereon or therein to move upwardly, as shown by the arrow 100, past the panel 28 mounting arrays 21, 23 and 25 (FIG. 4) of UV LED assemblies, much the same as in the UV curing apparatus, assembly and device shown in FIG. 5.

In the apparatus, assembly or device shown in FIG. 6, a gas tube 104 providing a lower gas injector is positioned near a lower end 106 of the path 100 of movement of the web 74 for injecting an inert lighter-than-air, non-oxygen-containing gas, e.g., helium, in the area between the orbiting panel 28 (FIG. 4) and the upwardly moving web 74 (FIG. 6) thereby provide an anaerobic area to enhance and facilitate curing of the UV photo initiators in the UV curable products, articles or other objects that are carried by the web 74.

A wiper blade 108 (FIG. 6) providing an upper inhibitor 108 is positioned near the upper edge 68 of the panel 28 as shown in FIG. 6 to minimize the escape of the lighter-than-air gas and hold, compress, collect and/or blanket the injected gas in the curing area between the orbiting panel 28 (FIG. 4) and the moving web 74 (FIG. 6), much the same as in the UV curing apparatus, assembly and device shown in FIG. 5. Again, the wiper blade 108 (FIG. 6) can be fixed to the upper edge 68 and arranged to wipe against the web 74.

To avoid overheating the UV LED assemblies 10, i.e., to control the heat generated by the UV LED assemblies 10, the power supplied to the UV LED assemblies can be periodically or sequentially activated and deactivated, i.e. can be turned on and off, at a relatively high frequency. Also, the duty cycle of the on-off cycle can be varied to adjust the UV light intensity.

Figure 7:
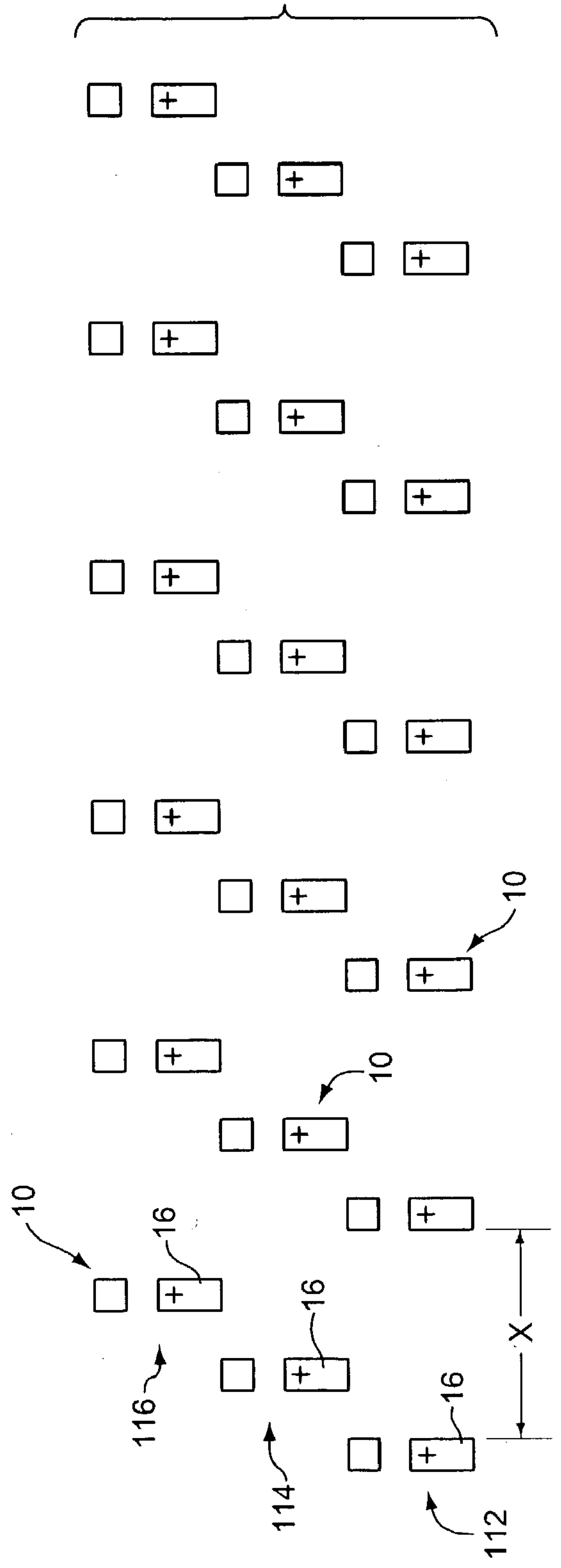
FIG. 7 is a plan view of another way of positioning UV LED assemblies in at least three rows where the spacing between UV LED assemblies in each row is increased to establish a three tier staggering of UV LED assemblies.

In FIG. 7 is illustrated another way to position the UV LED assemblies, namely, the LED chips 16, and achieve the same uniformity as shown in FIGS. 2 and 3. This would be to use 3 rows to achieve the uniformity. That is, to have the LED chips 16 in a first row 112 arranged at a distance of X, and to have the next row 114 (row 2) start at a distance ⅓ in from the start of the first row 112 and the next row 116 (row 3) start at a distance ⅔ in from the start of the first row 112 or at a distance ⅓ in from the start of the second row 114.

It will be understood that the space X of FIG. 7 can be equal to the width, of double the width, triple the width, quadruple the width, five times the width of an UV LED assembly 10 to provide a desired staggering of the light beams from the UV LED assemblies 10.

Also, in situations where UV curable ink or adhesive might splatter on the UV LED assemblies 10, a clear/transparent sheet or layer of plastic material can be placed over the arrays 21, 23 and 25 to protect the UV LED assemblies 10. Then, the sheet or layer is cleaned or replaced periodically.

From the foregoing description it will be apparent that the method and device of the present invention have a number of advantages, some of which have been described above and others of which are inherent in the invention. For example, the panel 28 of UV LED assemblies 10 can be arranged closely adjacent the web 74 carrying UV curable products, articles or other objects which enables UV light from UV LED assemblies 10 to better effect curing of the UV curable ink, coating and/or adhesive.

Further, the moving of the web 74, carrying the UV curable products, articles or other objects past staggered rows of UV LED assemblies 10 in staggered arrays 21, 23 and 25 of UV LED assemblies 10 on the panel 28 ensures uniform application of UV light to all of the ink, coating and/or adhesive to be cured in the UV curable product, article or object.

Still further, the oscillating or orbital movement of the UV LED assemblies 10 adjacent the moving web containing the UV curable products, articles or other objects to be cured ensures a more uniform sweeping of the UV light over the UV curable products, articles or other objects on or in the web 74.

Finally, the application of a heavier-than-air or a lighter-than-air, non-oxygen-containing gas to the area between the oscillating or orbiting panel 28 of UV LED assemblies 10 and the web 74 carrying the UV curable products, articles or other objects having monomer material to be cured or polymerized enhances the emission and application of more uniform UV light upon the UV curable products, articles, or other objects.

Although embodiments of the invention have been shown and described, it will be understood that various modifications and substitutions, as well as rearrangements of components, parts, equipment, apparatus, process (method) steps, and uses thereof, can be made by those skilled in the art without departing from the teachings of the invention. Accordingly, the scope of the invention is only to be limited as necessitated by the accompanying claims.

I claim:

1. An ultraviolet (UV) curing apparatus for applying UV light to UV photo initiators in UV curable inks, coatings, or adhesives on products, articles, or other objects, comprising:

at least one UV light-emitting device comprising a panel with a set of staggered rows of UV light emitting diode (LED) assemblies comprising UV LED chips connected to cathode pads and anodes including a first row of UV LED assemblies and a second row of UV LED assemblies, each of the UV LED chips of the UV LED assemblies in the first row are spaced apart from and positioned in offset staggered relationship to each of the UV LED chips in the UV LED assemblies in the second row and said panel having a first, a second, a third and a fourth side;

a conveyor for moving the UV curable inks, coatings, or adhesives, on the products, articles or other objects; and a panel-moving mechanism operatively connected to said light-emitting device for causing movement of said panel in an elliptical path in proximity to the photo initiators while UV light is emitted from the staggered rows of UV LED assemblies to uniformly apply, distribute or sweep UV light on the UV photo initiators and uniformly cure the UV curable inks, coatings, or adhesives, on the products, articles, or other objects;

said panel-moving mechanism including a first spring mounted adjacent said first side of said panel;

a first shaft;

a first cam eccentrically mounted adjacent said third side of said panel on said first shaft; and a first driver for rotating said first shaft to rotate said first eccentrically mounted cam and move said panel in a path against said first spring;

a second spring mounted adjacent said second side of said panel, a second shaft;

a second cam eccentrically mounted adjacent said fourth side of said panel on said second shaft; and a second driver for rotating said second shaft to rotate said second eccentrically mounted cam and move said panel simultaneously in a second path against said second spring; and said UV LED assemblies on said panel-moving mechanism are positioned approximately 0.001 inch to 0.3 inch from said UV photo initiators.

2. The UV curing apparatus of claim 1 comprising a plurality of panels with staggered rows of UV LED assemblies.

3. The UV curing apparatus of claim 1 including a gas injector for injecting a gas in an anaerobic area between the UV photo initiators and the UV LED assemblies on the panel-moving mechanism to facilitate curing of the UV curable inks, coatings, or adhesives, on the products, articles, or other objects.

4. The UV curing apparatus of claim 3 including a transparent sheet or layer of plastic material positioned over the UV LED assemblies on the panel to protect the UV LED assemblies from splatter of UV curable inks, adhesives, or coatings.

5. An ultraviolet (UV) curing apparatus, comprising:

a conveyor having a conveyor belt comprising web roller assemblies for moving a web, said conveyor belt carrying UV photoinitiators in UV curable inks, coatings, or adhesives on products, articles, and other objects;

a UV light-emitting device comprising a panel with a set of staggered rows of UV light-emitting diode (LED) assemblies, comprising UV LED chips connected to cathode pads and anodes so that the UV LED chips of the UV LED assemblies in each row are spaced apart and offset from the UV LED chips of the LED assemblies in an adjacent row, said panel being positioned adjacent the moving conveyor belt and said panel having a first side, a second side, a third side and a fourth side; and, a moving mechanism comprising a first eccentrically mounted cam acting against said first side of said panel, a first spring acting against said third side of the panel opposite the first side, a second eccentrically mounted cam acting against a second side of the panel, a second spring acting against a fourth side of the panel opposite said second side of the panel, for moving the panel containing the staggered rows of UV LED assemblies in a path in proximity to the UV curable inks, coatings, or adhesives on the products, articles, or other objects as the conveyor belt carrying the UV curable inks, coatings, or adhesives on the products, articles, or other objects moves past the panel while the UV LED chips emit UV light uniformly upon the UV curable inks, coatings, or adhesives on the products, articles, or other objects to uniformly cure the UV curable inks, coatings, or adhesives on the products, articles, or other objects, said first and second eccentrically mounted cams cooperating to reciprocally move the panel in both an X axis path and a Y axis path to move and oscillate the panel in a generally orbital, annular, circular or elliptical path as the web carrying the UV curable inks, coatings, or adhesives on the products, articles or other objects are moved past the panel.

* * * * *